(12) United States Patent
Zhang et al.

(10) Patent No.: US 12,046,594 B1
(45) Date of Patent: Jul. 23, 2024

(54) MONOLITHICALLY INTEGRATED GaN-BASED HALF-BRIDGE CIRCUIT AND HALF-BRIDGE CIRCUIT

(71) Applicant: SOUTHEAST UNIVERSITY, Nanjing (CN)

(72) Inventors: Long Zhang, Nanjing (CN); Weifeng Sun, Nanjing (CN); Siyang Liu, Nanjing (CN); Chengwu Pan, Nanjing (CN); Guiqiang Zheng, Nanjing (CN); Longxing Shi, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 0 days.

(21) Appl. No.: 18/638,735

(22) Filed: Apr. 18, 2024

Related U.S. Application Data (63) Continuation of application No. PCT/CN2023/124199, filed on Oct. 12, 2023.

(30) Foreign Application Priority Data

May 17, 2023 (CN) .......................... 202310553782.0

(51) Int. Cl.
| | |
|---|---|
| *H01L 27/06* | (2006.01) |
| *H01L 23/528* | (2006.01) |
| *H01L 29/20* | (2006.01) |
| *H01L 29/778* | (2006.01) |
| *H01L 29/8605* | (2006.01) |
| *H01L 29/872* | (2006.01) |

(Continued)

(52) U.S. Cl.
CPC ...... *H01L 27/0605* (2013.01); *H01L 23/5286* (2013.01); *H01L 27/0629* (2013.01); *H01L 27/0635* (2013.01); *H01L 28/60* (2013.01); *H01L 29/2003* (2013.01); *H01L 29/7786* (2013.01); *H01L 29/8605* (2013.01); *H01L 29/872* (2013.01); *H02M 1/08* (2013.01)

(58) Field of Classification Search
None
See application file for complete search history.

(56) References Cited

U.S. PATENT DOCUMENTS

2021/0344340 A1  11/2021  Kim et al.

FOREIGN PATENT DOCUMENTS

| CN | 104143929 A | 11/2014 |
|---|---|---|
| CN | 104241282 A | 12/2014 |

(Continued)

*Primary Examiner* — Grant S Withers
(74) *Attorney, Agent, or Firm* — Bayramoglu Law Offices LLC (57) ABSTRACT

In the monolithically integrated GaN-based half-bridge circuit, a nucleation layer, a buffer layer, a channel layer and a barrier layer are sequentially provided on a conductive substrate, the barrier layer and the channel layer are separated by isolation layers, and a diode, an integrated capacitor, a low-side transistor, a high-side transistor, a first integrated resistor and a second integrated resistor are provided. The half-bridge circuit includes: a low-side transistor and a high-side transistor, wherein a drain of the low-side transistor is connected to a source of the high-side transistor and also connected to an output terminal Vout, and a substrate of the low-side transistor is connected to a substrate of the high-side transistor, wherein a series resistor is connected in parallel to a drain of the high-side transistor and a source of the low-side transistor.

8 Claims, 10 Drawing Sheets

(51) Int. Cl.
*H01L 49/02* (2006.01)
*H02M 1/08* (2006.01)

(56) References Cited

FOREIGN PATENT DOCUMENTS

| | | |
|---|---|---|
| CN | 105409123 A | 3/2016 |
| CN | 116525612 A | 8/2023 |

MONOLITHICALLY INTEGRATED GaN-BASED HALF-BRIDGE CIRCUIT AND HALF-BRIDGE CIRCUIT

CROSS REFERENCE TO THE RELATED APPLICATIONS

This application is the Continuation Application of International Application No. PCT/CN2023/124199, filed on Oct. 12, 2023, which is based upon and claims priority to Chinese Patent Application No. 202310553782.0, filed on May 17, 2023, the entire contents of which are incorporated herein by reference.

TECHNICAL FIELD

The present invention relates to the technical field of semiconductor devices and integrated circuits, in particular to a monolithically integrated GaN-based half-bridge circuit and a half-bridge circuit.

BACKGROUND ART

Power integrated circuits are widely used in various fields such as power transmission, electric vehicles, and household appliances, and are inseparable from production and life. Power devices are the core of power integrated circuits. With the development of science and technology, today's semiconductor industry has increasing requirements for power devices, mainly including high power density, low on-resistance, high reliability, high frequency, small size and strong radiation resistance. However, the performance of silicon-based materials has approached its theoretical limit, so the application of third-generation semiconductor materials is imperative. The third-generation semiconductor material, gallium nitride, has the advantages of wide band gap, strong critical breakdown field and high electron saturation velocity. The heterojunction formed by gallium nitride (GaN) and aluminum gallium nitride (AlGaN) will form a high concentration of two-dimensional electron gas at the interface and can be used in high electron mobility transistors (HEMTs). With electron mobility high up to 900-2000 $cm^2/V \cdot$, the HEMT can achieve an on-resistance much lower than that of silicon-based devices, so it is very suitable for power devices.

Power devices are often used to form half-bridge circuits in power integrated circuits. As the "gateway" for power transmission, the performance of the half-bridge circuits plays an important role in power integrated circuits. For a half-bridge circuit integrated on a substrate, the uniformization in the substrate source potential of the high-side transistor and the low-side transistor has always been a problem affecting its development. Taking the above-mentioned GaN HEMT device as an example, there should be no bias between the substrate and source of the device during normal operation. In use of a half-bridge circuit, the source of the high-side transistor and the drain of the low-side transistor are connected together. As a result, when the substrate is connected in different ways, the high-side transistor and the low-side transistor face different different substrate-source bias problems. This situation of a bias voltage between the substrate and the source is called the substrate bias effect. Research shows that static negative bias of the substrate will cause an increase in on-resistance while static positive bias will not affect on-resistance, and both dynamic negative bias and dynamic positive bias will cause the on-resistance to increase first and then return to normal. Therefore, the static negative bias, dynamic negative bias and dynamic positive bias of the substrate should be avoided in the design.

Existing commercially available monolithically integrated GaN-based half-bridge circuits mainly reduce the adverse effects of substrate bias effect by connecting the substrate to GND or the output terminal Vout. However, in a case where the substrate is connected to GND, if the high-side transistor is turned on and the low-side transistor is turned off, the high-side transistor will have a severe static negative bias, causing the on-resistance of the high-side transistor to significantly increase and seriously increasing the power loss. In a case where the substrate is connected to the output terminal Vout, when the low-side transistor switches from off to on, the low-side transistor will have a dynamic positive bias, causing the on-resistance of the low-side transistor to increase and seriously increasing the power loss. The high-side transistor and low-side transistor in a half-bridge structure can be realized through dielectric isolation, but this will complicate the process, reduce the manufacturing yield, and is not conducive to the compatibility of integrated circuit manufacturing. External passive components can also greatly ameliorate the substrate bias effect, but this also greatly limits the use of half-bridge circuits in fields that require high reliability, high frequency, small size and strong radiation resistance. Therefore, a monolithically integrated GaN-based half-bridge circuit that is less affected by the substrate bias effect and can meet the requirements in special application fields is desired.

SUMMARY OF THE INVENTION

In view of the above problems, the present invention discloses a monolithically integrated GaN-based half-bridge circuit and a half-bridge circuit, where a GaN HEMT half-bridge circuit and passive components such as resistors are integrated on a same substrate to ameliorate the increase in on-resistance of GaN HEMTs caused by the substrate bias effect, thereby reducing the power loss of the half-bridge circuit.

The technical solution of the present invention is as follows:

A monolithically integrated GaN-based half-bridge circuit according to the present invention includes: a base, wherein the base includes a conductive substrate, wherein a nucleation layer, a buffer layer, a channel layer and a barrier layer are sequentially provided on the conductive substrate, and an oxide passivation layer is provided on the barrier layer; the base further includes isolation layers, wherein the isolation layers start from a surface of the barrier layer, pass through the barrier layer and the channel layer before entering the buffer layer, the barrier layer and the channel layer are divided by the isolation layers to form a diode capacitor region, a low-side transistor region, a high-side transistor region, a first resistor region and a second resistor region, a diode and an integrated capacitor are arranged on the diode capacitor region, and a low-side transistor, a high-side transistor, a first integrated resistor and a second integrated resistor are respectively arranged on the low-side transistor region, the high-side transistor region, the first resistor region and the second resistor region;

the diode includes a source metal connected to an upper surface of the barrier layer in the diode capacitor region, a first P-GaN layer, and a cathode metal that also serves as a plate of the integrated capacitor, wherein a gate metal is provided on the first P-GaN layer, and the source metal is connected to the gate metal and serves as an anode of the diode; a ground metal serving as the other plate of the integrated capacitor is provided on a surface of the oxide passivation layer;

the low-side transistor includes a low-side transistor source metal connected to the upper surface of the barrier layer in the low-side transistor region, a second P-GaN layer, and a low-side transistor drain metal, wherein a low-side transistor gate metal is provided on the second P-GaN layer;

the high-side transistor includes a high-side transistor source metal connected to the upper surface of the barrier layer in the high-side transistor region and connected to the low-side transistor drain metal and the anode of the diode, a third P-GaN layer, and a high-side transistor drain metal, wherein a high-side transistor gate metal is provided on the third P-GaN layer;

the first integrated resistor and the second integrated resistor are connected in series at a series node that is connected to the conductive substrate, one end of series connection of the first integrated resistor and the second integrated resistor is connected to the high-side transistor drain metal, and the other end of the series connection of the first integrated resistor and the second integrated resistor is connected to the ground metal.

A half-bridge circuit according to the present invention includes: a low-side transistor and a high-side transistor, wherein a drain of the low-side transistor is connected to a source of the high-side transistor and also connected to an output terminal Vout, and a substrate of the low-side transistor is connected to a substrate of the high-side transistor, wherein a series resistor is connected in parallel to a high-side transistor drain metal and a low-side transistor source metal, and the series resistor is composed of a first integrated resistor and a second integrated resistor connected in series at a series node that is connected to a conductive substrate; an integrated capacitor is connected in parallel to the series node and the low-side transistor source metal; a diode is connected between the output terminal Vout and the series node, and the diode has an anode connected to the output terminal Vout and a cathode connected to the series node.

Compared with the prior art, the structure of the present invention has the following advantages:

1. According to the present invention, the substrate is connected to the source of the low-side transistor through a resistor, capacitors are also connected in parallel to both ends of the resistor, and the substrate is connected to the drain of the high-side transistor through the resistor and to the output terminal through a diode. Given that the diode has a forward on voltage drop $V_F$, when the high-side transistor is turned on, the substrate-source voltage difference $V_{BS}$ of the high-side transistor is about $-V_F$, thus avoiding the static negative bias effect when the high-side transistor is turned on. When the low-side transistor switches from off to on, due to voltage stabilization by the capacitors, the substrate-source voltage difference $V_{BS}$ of the low-side transistor slowly decreases from $V_{BUS}-V_F$ to $V_{BUS}/2$, which slows down the $V_{BS}$ conversion speed, thereby reducing the dynamic positive bias effect. When the high-side transistor switches from off to on, due to voltage stabilization by the capacitors, the substrate-source voltage difference $V_{BS}$ of the high-side transistor slowly decreases from $V_{BUS}/2$ to $-V_F$, which slows down the $V_{BS}$ conversion speed, thus reducing the dynamic positive bias effect.

2. The present invention integrates GaN HEMT devices and passive components on the same substrate, thereby ameliorating the substrate bias effect while retaining the excellent operating characteristics brought by GaN materials. According to the present invention, the substrate potential is led to the surface metal interconnection layer by substrate through holes. The substrate through holes can effectively enhance the bonding strength between the metal and the substrate and avoid the problem of metal peeling or falling off. In addition, the substrate through holes can also be used to prevent mutual interference between the electric fields inside and outside the device and improve the electromagnetic compatibility (EMC) of the circuit. According to the present invention, passive components are formed through two-dimensional electron gas or two-dimensional hole gas and interconnected metal. The passive components are connected between the substrate potential and the source or drain of the GaN HEMT device and play the role of voltage divider and gate, thus ameliorating the adverse impact of the substrate bias effect on the half-bridge structure. Since the passive components are also GaN-based, they have the same advantages as GaNHEMT devices such as high operating temperature, high operating frequency, high breakdown field strength and strong radiation resistance, thus avoiding the limitations of external passive components on the working environment of GaN HEMT devices.

3. The present invention integrates active components and passive components on the same GaN substrate, realizing full integration of active components and passive components inside a chip, increasing the degree of integration and reducing area requirements. Existing GaN-based power device modules ameliorate the substrate bias effect by connecting external passive components to the half-bridge chip, which complicates the module and increases the area of the power modules. In contrast, the present invention integrates various components in the half-bridge module into the same chip, reducing the area occupied by the entire power module, making the external circuit of the half-bridge chip simpler, improving the reliability of the circuit operation, and greatly simplifying the design, commissioning and installation of the entire system.

4. The present invention avoids electrical signal oscillation caused by parasitic inductance and parasitic capacitance introduced by external passive components. For the half-bridge structure, external passive components can suppress to a certain extent the adverse effects of the substrate bias effect. However, the enlarged circuit board and additional interconnection lines introduce additional parasitic inductance and parasitic capacitance, which can easily cause electrical signal oscillation in the circuit. The present invention integrates passive components and half-bridge circuits on the same substrate, which can not only suppress the substrate bias effect in the half-bridge structure, but also greatly reduce parasitic inductance and parasitic capacitance, thereby avoiding the occurrence of electrical signal oscillation and achieving better operating stability.

DETAILED DESCRIPTION OF THE EMBODIMENTS

The following is the specific implementation of a monolithically integrated GaN-based half-bridge circuit, that is, a monolithically integrated GaN-based half-bridge circuit includes: a base 10, wherein the base 10 includes a conductive substrate 11, a nucleation layer 12, a buffer layer 13, a channel layer 14 and a barrier layer 15 are sequentially provided on the conductive substrate 11, and an oxide passivation layer 90 is provided on the barrier layer 15; the base 10 further includes isolation layers 80, wherein the isolation layers 80 start from a surface of the barrier layer 15, pass through the barrier layer 15 and the channel layer 14 before entering the buffer layer 13, the barrier layer 15 and the channel layer 14 are divided by the isolation layers 80 to form a diode capacitor region, a low-side transistor region, a high-side transistor region, a first resistor region and a second resistor region, a diode 20 and an integrated capacitor 30 are arranged on the diode capacitor region, and a low-side transistor 40, a high-side transistor 50, a first integrated resistor 60 and a second integrated resistor 70 are respectively arranged on the low-side transistor region, the high-side transistor region, the first resistor region and the second resistor region;

the diode 20 includes a source metal 21 connected to an upper surface of the barrier layer 15 in the diode capacitor region, a first P-GaN layer 22, and a cathode metal 24 that also serves as a plate of the integrated capacitor 30, wherein a gate metal 23 is provided on the first P-GaN layer 22, and the source metal 21 is connected to the gate metal 23 and serves as an anode of the diode 20; a ground metal A2 serving as the other plate of the integrated capacitor 30 is provided on a surface of the oxide passivation layer 90;

the low-side transistor 40 includes a low-side transistor source metal 41 connected to the upper surface of the barrier layer 15 in the low-side transistor region, a second P-GaN layer 42, and a low-side transistor drain metal 44, wherein a low-side transistor gate metal 43 is provided on the second P-GaN layer 42;

the high-side transistor 50 includes a high-side transistor source metal 51 connected to the upper surface of the barrier layer 15 in the high-side transistor region and connected to the low-side transistor drain metal 44 and the anode of the diode 20, a third P-GaN layer 52, and a high-side transistor drain metal 54, wherein a high-side transistor gate metal 53 is provided on the third P-GaN layer 52;

the first integrated resistor 60 and the second integrated resistor 70 are connected in series at a series node that is connected to the conductive substrate 11, one end of series connection of the first integrated resistor 60 and the second integrated resistor 70 is connected to the high-side transistor drain metal 51, and the other end of the series connection of the first integrated resistor 60 and the second integrated resistor 70 is connected to the ground metal A2. The above-mentioned series connection of the first integrated resistor 60 and the second integrated resistor 70 may be implemented by using a substrate metal A4 provided in the oxide passivation layer 90.

In this embodiment, a first substrate through-hole metal 25 is formed in the diode capacitor region, and the first substrate through-hole metal 25 is connected to the cathode metal 24, and the first substrate through-hole metal 25 extends and is connected to the conductive substrate 11; a silicon dielectric layer 31 is provided between the two plates of the integrated capacitor 30;

In this embodiment, a second substrate through-hole metal 63 may be formed in the first resistor region or the second resistor region, the second substrate through-hole metal 63 is connected to the series node of the first integrated resistor 60 and the second integrated resistor 70 and extends to be connected to the conductive substrate 11; the first substrate through-hole metal 25 and the diode capacitor region are located on one side of the barrier layer 15, and the second substrate through-hole metal 63, the first resistor region and the second resistor region are located on the other side of the barrier layer 15; alternatively, in this embodiment, a first substrate through-hole metal 25 is formed in the barrier layer 15, and the first substrate through-hole metal 25 extends and is connected to the conductive substrate 11, the first substrate through-hole metal 25 is connected to the cathode metal 24 and the series node of the first integrated resistor 60 and the second integrated resistor 70 respectively, and the anode of the diode 20 is connected to the high-side transistor source metal 51 through an anode metal A1 and is connected to the output terminal Vout; the first substrate through-hole metal 25, the cathode metal 24, the anode metal A1 and the output terminal Vout are located in a middle part of the GaN-based half-bridge circuit, the first integrated resistor 60 and the second integrated resistor 70 are respectively located on both sides of the middle part, and the low-side transistor 40 and the high-side transistor 50 are respectively located on both sides of the middle part.

The following is the specific implementation of a half-bridge circuit, that is, a half-bridge circuit includes: a low-side transistor 40 and a high-side transistor 50, wherein a drain of the low-side transistor 40 is connected to a source of the high-side transistor 50 and also connected to an output terminal Vout, and a substrate of the low-side transistor 40 is connected to a substrate of the high-side transistor 50, wherein a series resistor is connected in parallel to a high-side transistor drain metal 54 and a low-side transistor source metal 41, and the series resistor is composed of a first integrated resistor 60 and a second integrated resistor 70 connected in series at a series node that is connected to a conductive substrate 11; an integrated capacitor 30 is connected in parallel to the series node and the low-side transistor source metal 41; a diode 20 is connected between the output terminal Vout and the series node, and the diode 20 has an anode connected to the output terminal Vout and a cathode connected to the series node. In this embodiment, the low-side transistor 40 and the high-side transistor 50 are GaN HEMT devices.

The present invention will be described in detail with reference to the accompanying drawings.

Figure 1:
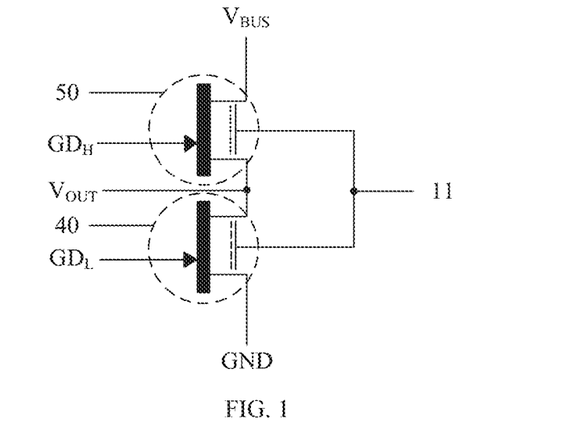
FIG. 1 shows a schematic diagram of a traditional GaN-based half-bridge circuit.
Figure 2:
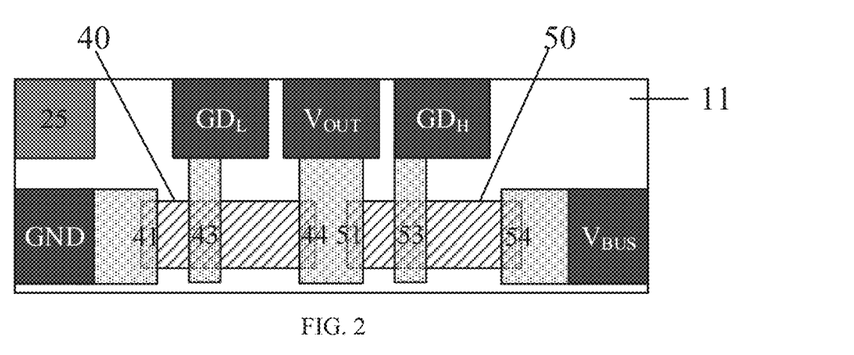
FIG. 2 shows a schematic plan view of the traditional GaN-based half-bridge circuit.
Figure 3:
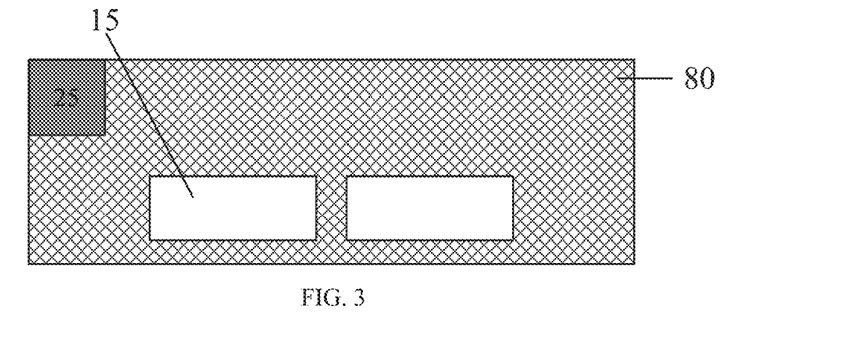
FIG. 3 shows a schematic plan view of the traditional GaN-based half-bridge circuit along a barrier layer 15.
Figure 4:
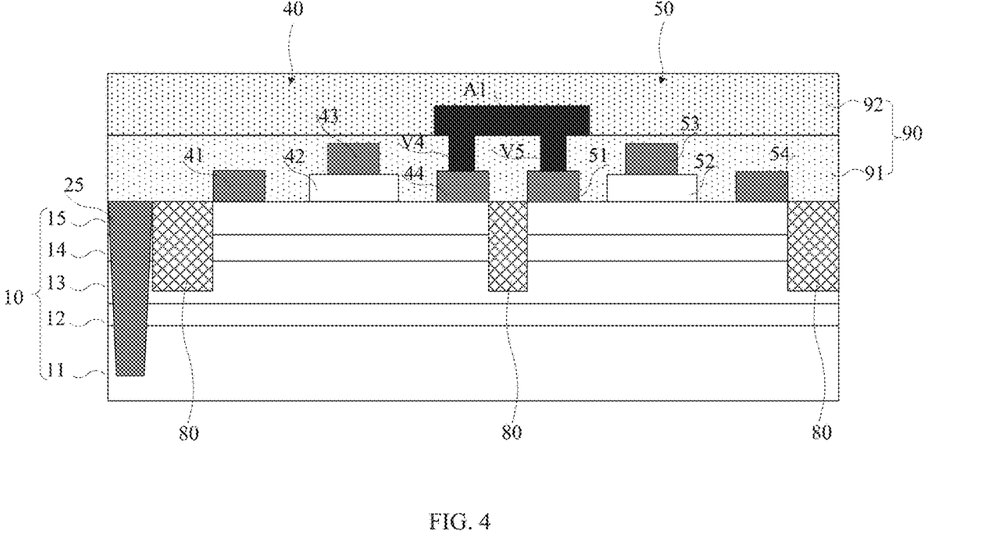
FIG. 4 shows a longitudinally expanded view of the traditional GaN-based half-bridge circuit (all parts are placed on the same straight line, which is not necessarily the case in reality).

FIGS. 1-4 show a traditional GaN-based half-bridge circuit, in which: FIG. 1 shows a schematic diagram of the traditional GaN-based half-bridge circuit, FIG. 2 shows a schematic plan view of the traditional GaN-based half-bridge circuit, FIG. 3 shows a schematic plan view of the traditional GaN-based half-bridge circuit along a barrier layer 15, and FIG. 4 shows a longitudinally expanded view of the traditional GaN-based half-bridge circuit (all parts are placed on the same straight line, which is not necessarily the case in reality). In view of this, the present invention provides a monolithically integrated GaN-based half-bridge circuit with integrated passive devices.

Embodiment 1

As shown in FIGS. 5-10, a monolithically integrated GaN-based half-bridge circuit is provided on the basis of the traditional GaN-based half-bridge circuit.

Figure 5:
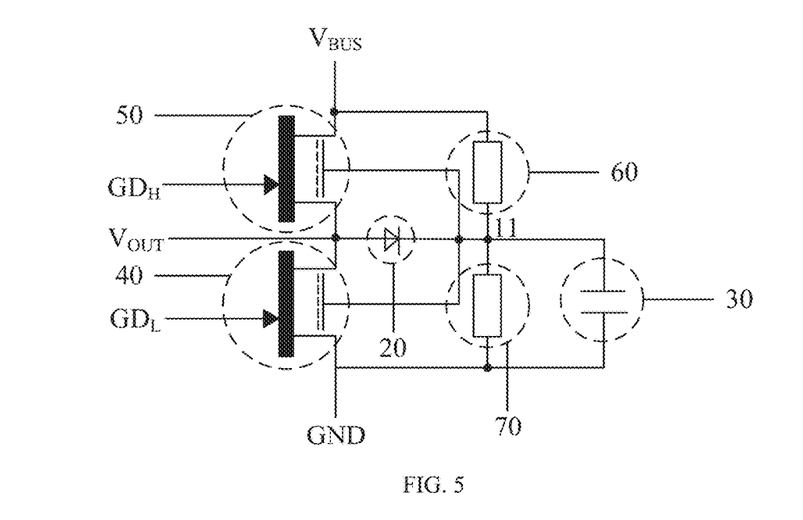
FIG. 5 shows a schematic diagram of a bridge circuit according to the present invention.
Figure 6:
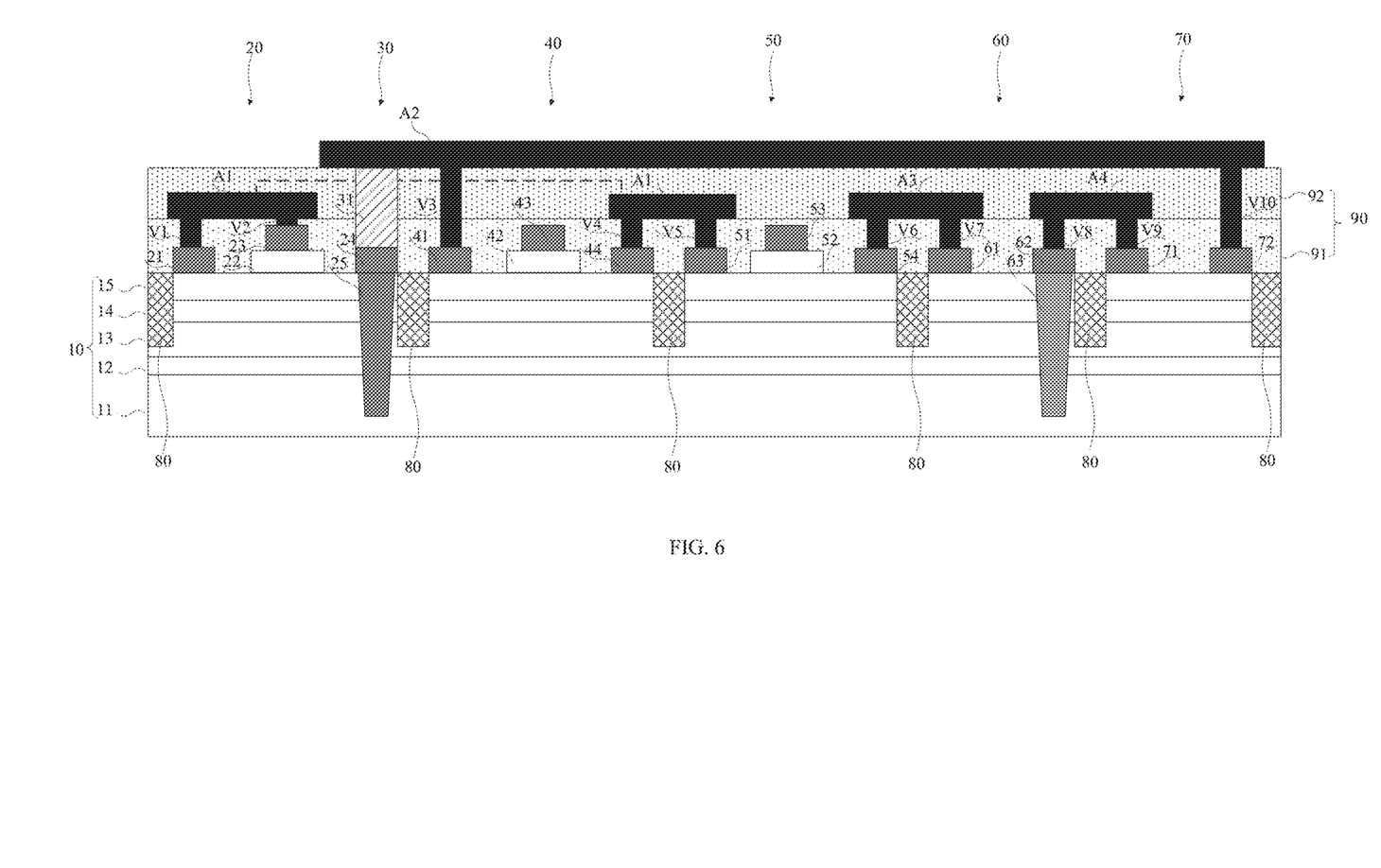
FIG. 6 shows a longitudinally expanded view of a monolithically integrated GaN-based half-bridge circuit according to Embodiment 1 of the present invention (all parts are placed on the same straight line, which is not necessarily the case in reality).

FIG. 5 shows a schematic diagram of the circuit according to this embodiment, and FIG. 6 shows a longitudinally expanded view of the monolithically integrated GaN-based half-bridge circuit according to this embodiment (all parts are placed on the same straight line, which is not necessarily the case in reality). A monolithically integrated GaN-based half-bridge circuit is provided on a base 10. The base 10 includes a conductive substrate 11, a nucleation layer 12, a buffer layer 13, a channel layer 14 and a barrier layer 15. A diode 20, an integrated capacitor 30, a low-side transistor 40, a high-side transistor 50, a first integrated resistor 60 and a second integrated resistor 70 are provided on the base 10. Isolation layers 80 are provided in the buffer layer 13, the channel layer 14 and the barrier layer 15. An oxide passivation layer is provided on the diode 20, the integrated capacitor 30, the low-side transistor 40, the high-side transistor 50, the first integrated resistor 60, and the second integrated resistor 70. The oxide passivation layer 90 includes: a first oxide passivation layer 91 and a second oxide passivation layer 92. The diode 20 includes a source metal 21, a first P-GaN layer 22, a gate metal 23, a cathode metal 24, a first substrate through-hole metal 25, a first through-hole metal V1, a second through-hole metal V2, and an anode metal A1, where the first through-hole metal V1 and the second through-hole metal V2 connect the source metal 21 and the gate metal 23 to form the anode metal A1, and the cathode metal 24 is connected to first substrate through-hole metal 25. The integrated capacitor 30 includes a cathode metal 24, a silicon dielectric layer 31, and a ground metal A2. The low-side transistor 40 includes a low-side transistor source metal 41, a second P-GaN layer 42, a low-side transistor gate metal 43, and a low-side transistor drain metal 44. The high-side transistor 50 includes a high-side transistor source metal 51, a third P-GaN layer 52, a high-side transistor gate metal 53 and a high-side transistor drain metal 54. The first integrated resistor 60 includes: a first integrated resistor terminal I 61, a first integrated resistor terminal II 62, a second substrate through-hole metal 63, where the first integrated resistor terminal II 62 is connected to the second substrate through-hole metal 63. The second integrated resistor 70 includes: a second integrated resistor terminal I 71 and a second integrated resistor terminal II 72. The anode metal A1 connects the low-side transistor drain metal 44 and the high-side transistor source metal 51 through a fourth through-hole metal V4 and a fifth through-hole metal V5. The ground metal A2 connects the low-side transistor source metal 41 and the second integrated resistor terminal II 72 through a third through hole metal V3 and a tenth through hole metal V10. A high-voltage end metal A3 connects the high-side transistor drain metal 54 and the first integrated resistor terminal I 61 through a sixth through-hole metal V6 and a seventh through-hole metal V7. A substrate metal A4 connects the first integrated resistor terminal II 62 and the second integrated resistor terminal I 71 through an eighth through hole metal V8 and a ninth through hole metal V9.

The first substrate through-hole metal 25 and the second substrate through-hole metal 63 are etched from the upper surface of the barrier layer to below the upper surface of the substrate using an etching technology to form a groove extending from the barrier layer to the substrate and filled with metal to finally form the substrate through-hole metal.

The first integrated resistor 60 and the second integrated resistor 70 are formed of two-dimensional electron gas or two-dimensional hole gas.

The diode 20, the low-side transistor 40, the high-side transistor 50, the first integrated resistor 60, and the second integrated resistor 70 include the barrier layer 15. The barrier layer is an AlGaN layer with a thickness of 10~45 nm, in which the content of Al is 0.10-0.35.

The diode 20, the low-side transistor 40, and the high-side transistor 50 include a P-GaN layer, and the P-GaN layer is doped with magnesium (Mg) in a concentration range of 1e18-1e20 cm$^{-3}$ The resistivity of the first integrated resistor 60 and the second integrated resistor 70 is within a range of 300-2,000 Ω/square.

Figure 7:
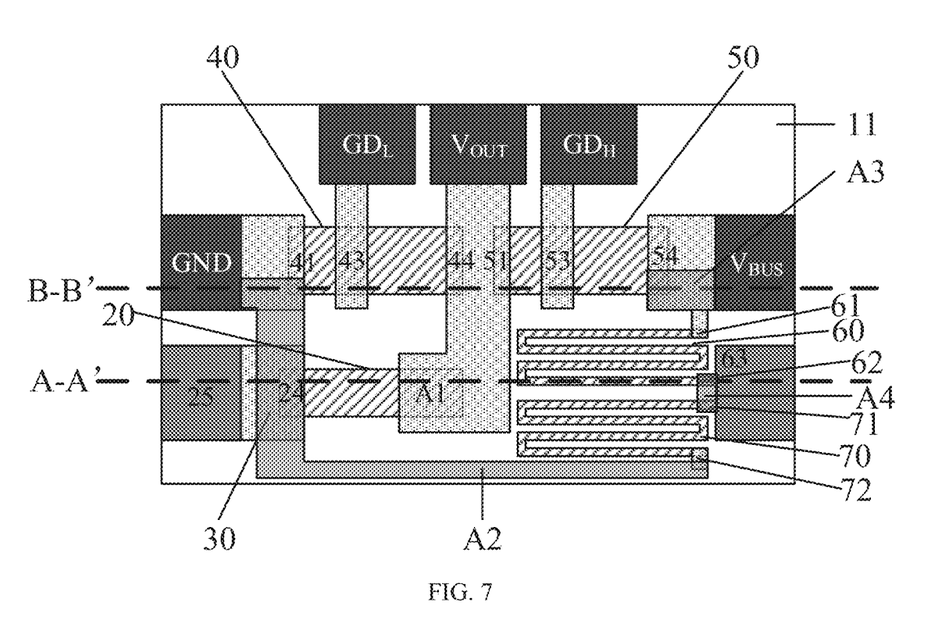
FIG. 7 shows a top view of the monolithically integrated GaN-based half-bridge circuit according to Embodiment 1 of the present invention.

FIG. 7 shows a schematic plan view of this embodiment. The cathode metal 24, the first integrated resistor terminal II 62, the second integrated resistor terminal I 71, and the conductive substrate 11 are connected to the same potential through the first substrate through-hole metal 25 and the second substrate through-hole metal 63. The high-side transistor drain metal 54 and the first integrated resistor terminal I 61 are connected to a power supply $V_{BUS}$ potential. The low-side transistor drain metal 44, the high-side transistor source metal 51 and the anode metal A1 are connected to the output terminal Vout. The low-side transistor source metal 41, the second integrated resistor terminal II 72 and the ground metal A2 are connected to a ground port GND. The high-side transistor gate metal 53 is connected to a high-side transistor external drive port $GD_H$. The low-side transistor gate metal 43 is connected to a low-side transistor external drive port $GD_L$.

Figure 8:
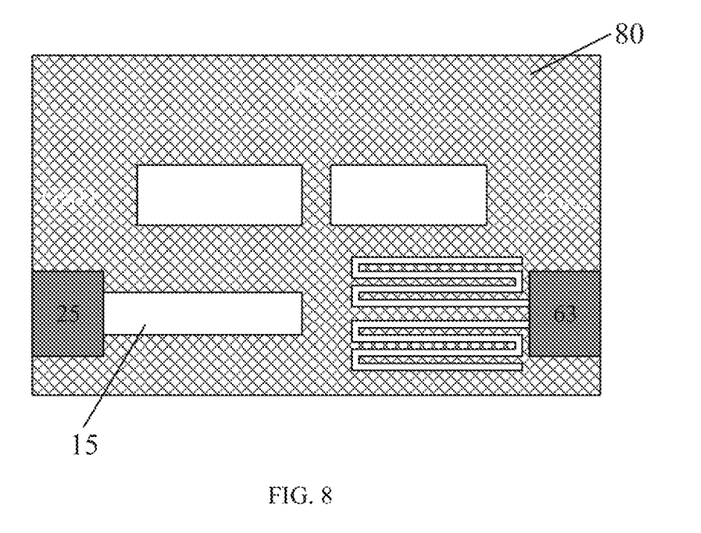
FIG. 8 shows a schematic plan view of the monolithically integrated GaN-based half-bridge circuit according to Embodiment 1 of the present invention along a barrier layer 15.

FIG. 8 shows a schematic plan view of the monolithically integrated GaN-based half-bridge circuit according to Embodiment 1 of the present invention along the barrier layer 15, including the first substrate through-hole metal 25, the second substrate through-hole metal 63, the barrier layer 15 and the isolation layer 80 formed by high-energy particle injection.

Figure 9:
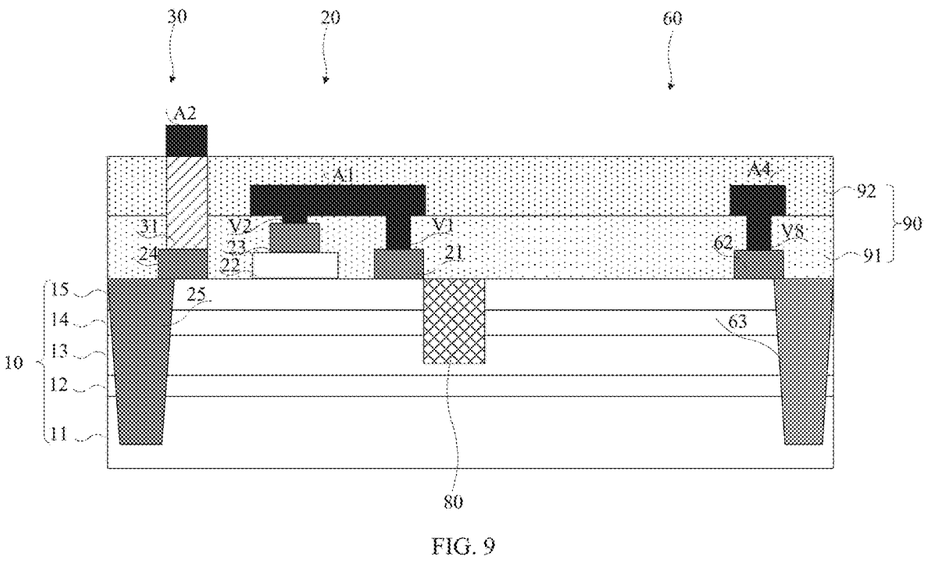
FIG. 9 shows a schematic longitudinal structural view taken along line A A' in FIG. 7.
Figure 10:
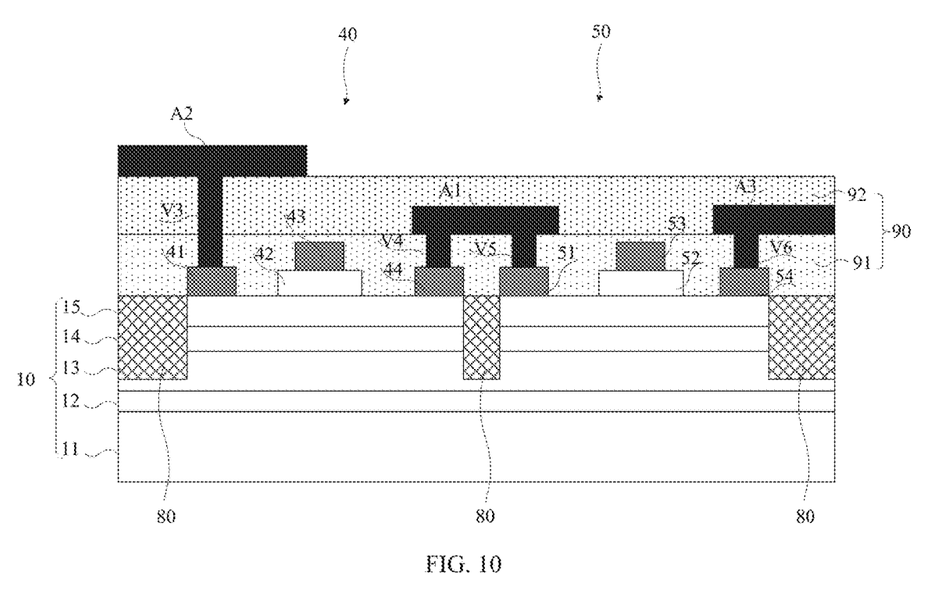
FIG. 10 shows a schematic longitudinal structural view taken along line B B' in FIG. 7.

FIG. 9 and FIG. 10 respectively show schematic longitudinal structural views taken along line A-A' and line B-B' in FIG. 7. Identical layers and components are given the same reference numerals in FIG. 6.

Operating principle of this embodiment: Referring to FIG. 5, given that the diode 20 has a forward on voltage drop $V_F$ and the power supply voltage is $V_{BUS}$, when the high-side transistor 50 is turned on and the low-side transistor 40 is turned off, the potential of the conductive substrate 11 is $V_{BUS}$-$V_F$, and the potential of the high-side transistor source metal 51 is $V_{BUS}$. In this case, there is a bias voltage –$V_F$ between the conductive substrate 11 and the high-side transistor source metal 51, and the static negative bias amplitude of the high-side transistor 50 is small, thereby avoiding the static negative bias effect; the potential of the low-side transistor source metal 41 is GND, and in this case there is a bias voltage $V_{BUS}$-$V_F$ between the conductive substrate 11 and the low-side transistor source metal 41, and the low-side transistor 40 has a static positive bias. When the high-side transistor 50 is turned off and the low-side transistor 40 is turned on, the potential of the conductive substrate 11 is $V_{BUS}$/2, and the potential of the high-side transistor source metal 51 is GND. In this case, there is a bias voltage $V_{BUS}$/2 between the conductive substrate 11 and the high-side transistor source metal 51, and the high-side transistor 50 has a static positive bias; the potential of the low-side transistor source metal 41 is GND, and in this case, there is a bias voltage $V_{BUS}$/2 between the conductive substrate 11 and the low-side transistor source metal 41, and the low-side transistor 40 has a static positive bias. When it changes from the case where the high-side transistor 50 is turned on and the low-side transistor 40 is turned off to the case where the high-side transistor 50 is turned off and the low-side transistor 40 is turned on, under the effect of the integrated capacitor 30, the potential conversion speed between the conductive substrate 11 and the low-side transistor source metal 41 is slowed down, thereby reducing the dynamic substrate bias effect. When it changes from the case where the high-side transistor 50 is turned off and the low-side transistor 40 is turned on to the case where the high-side transistor 50 is turned on and the low-side transistor 40 is turned off, under the effect of the integrated capacitor 30, the potential conversion speed between the substrate 11 and the high-side transistor source metal 51 is slowed down, thereby reducing the dynamic substrate bias effect.

Embodiment 2

Figure 11:
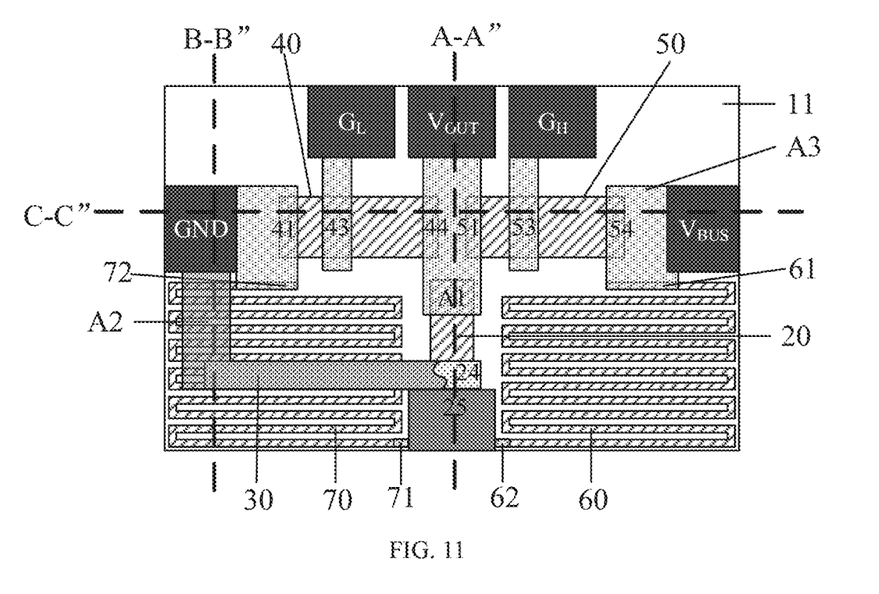
FIG. 11 shows a top view of a monolithic integrated GaN-based half-bridge circuit according to Embodiment 2 of the present invention.

As shown in FIG. 11, on the basis of Embodiment 1, the areas of the first integrated resistor 60 and the second integrated resistor 70 are further increased, and a larger integrated resistance value can be obtained as compared with Embodiment 1. Correspondingly, the position of the diode 20 is changed and only one substrate through hole is required. The embodiment works in the same way as Embodiment 1.

Figure 12:
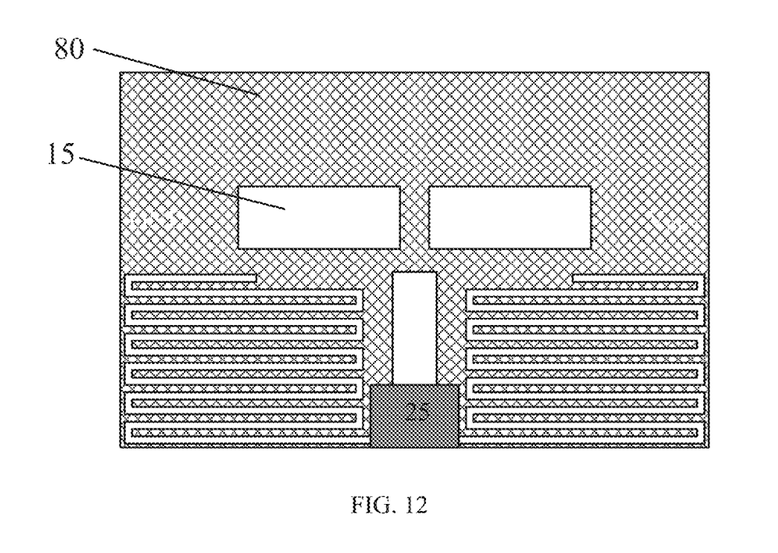
FIG. 12 shows a schematic plan view of the monolithically integrated GaN-based half-bridge circuit according to Embodiment 2 of the present invention along a barrier layer 15.

FIG. 12 shows a schematic plan view of the monolithically integrated GaN-based half-bridge circuit according to Embodiment 2 of the present invention along the barrier layer 15, including the first substrate through-hole metal 25, the barrier layer 15 and the isolation layer 80 formed by high-energy particle injection.

Figure 13:
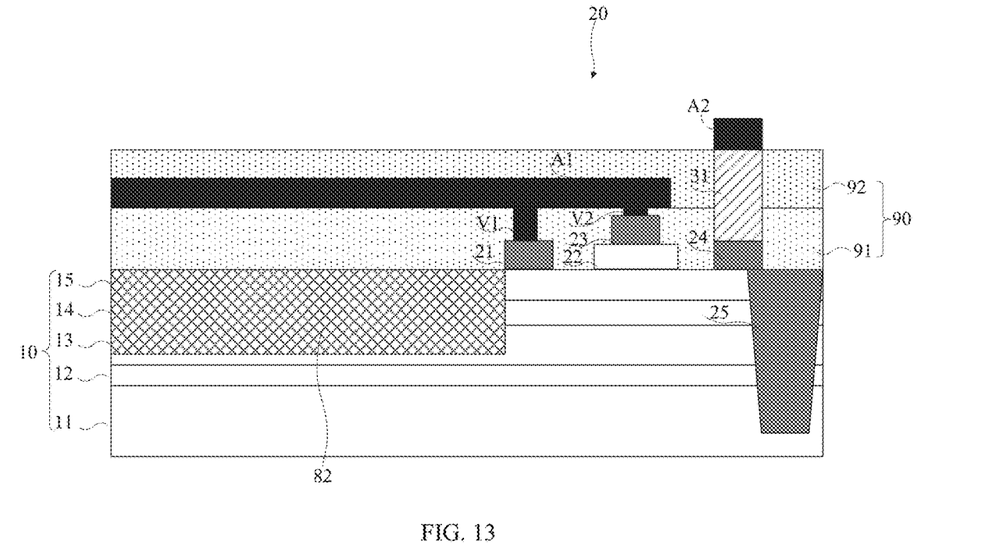
FIG. 13 shows a schematic longitudinal structural view taken along line A A" in FIG. 11.
Figure 14:
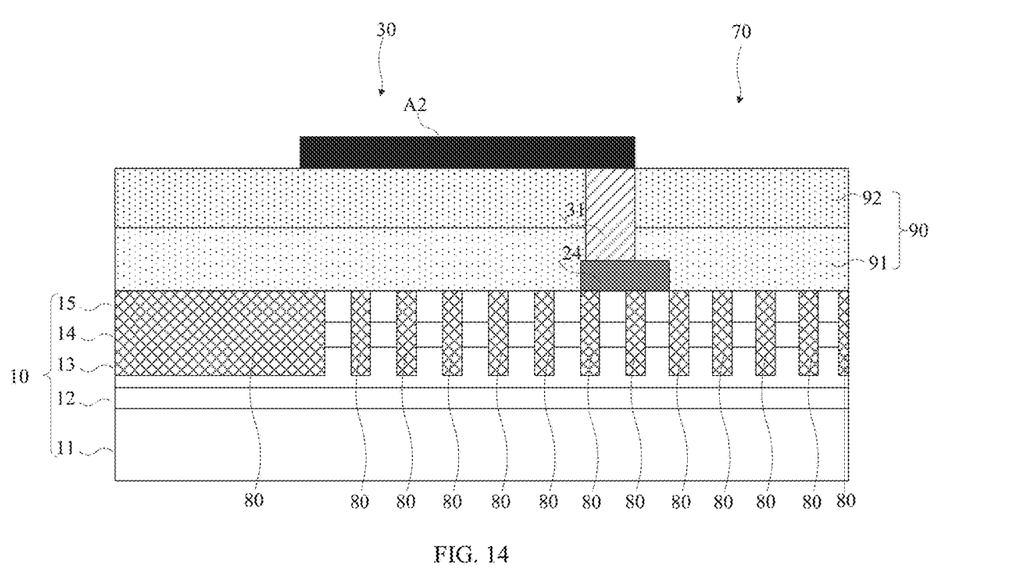
FIG. 14 shows a schematic longitudinal structural view taken along line B B" in FIG. 11.
Figure 15:
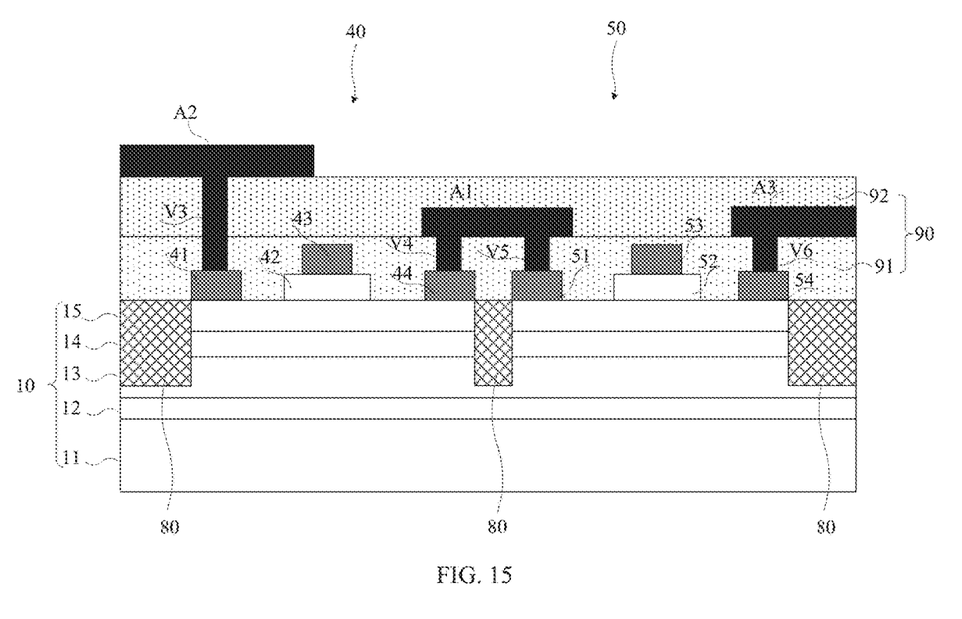
FIG. 15 shows a schematic longitudinal structural view taken along line C C" in FIG. 11.

FIG. 13, FIG. 14 and FIG. 15 respectively show schematic longitudinal structural views taken along line A-A', line B-B', and line C-C in FIG. 11. Identical layers and components are given the same reference numerals in FIG. 6.

Embodiment 3

Figure 16:
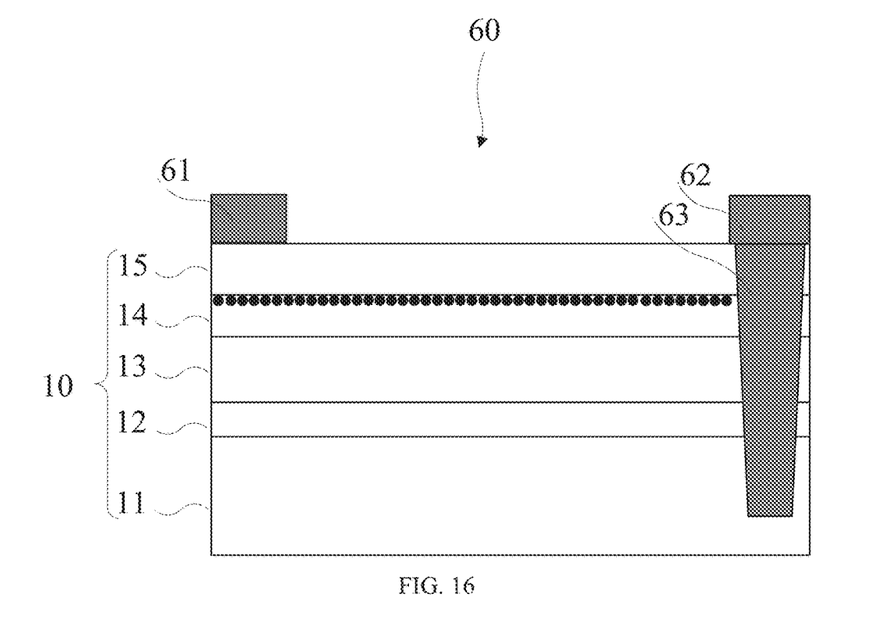
FIG. 16 shows a schematic diagram of a two-dimensional electron gas integrated resistor.
Figure 17:
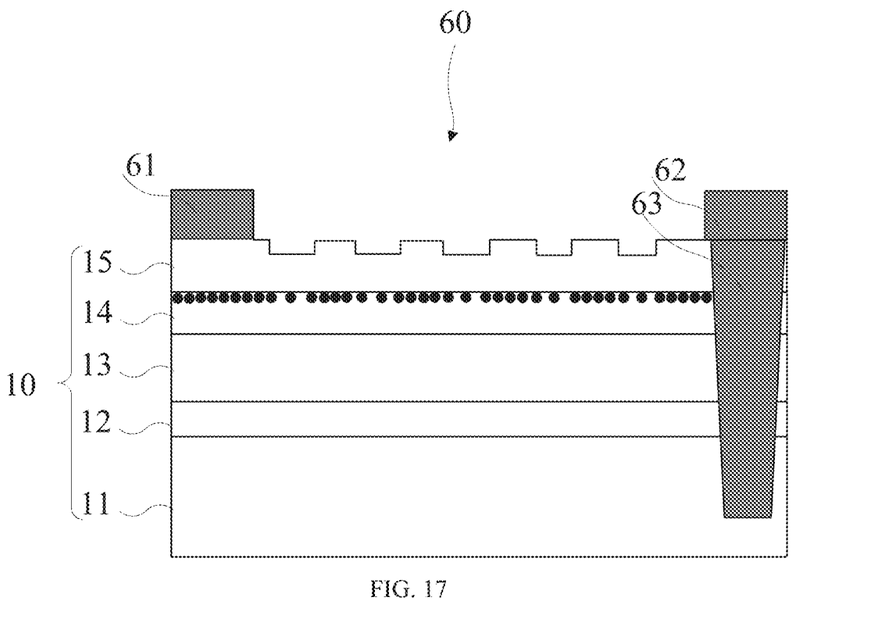
FIG. 17 shows a schematic diagram of a groove-type high-resistance two-dimensional electron gas integrated resistor.
Figure 18:
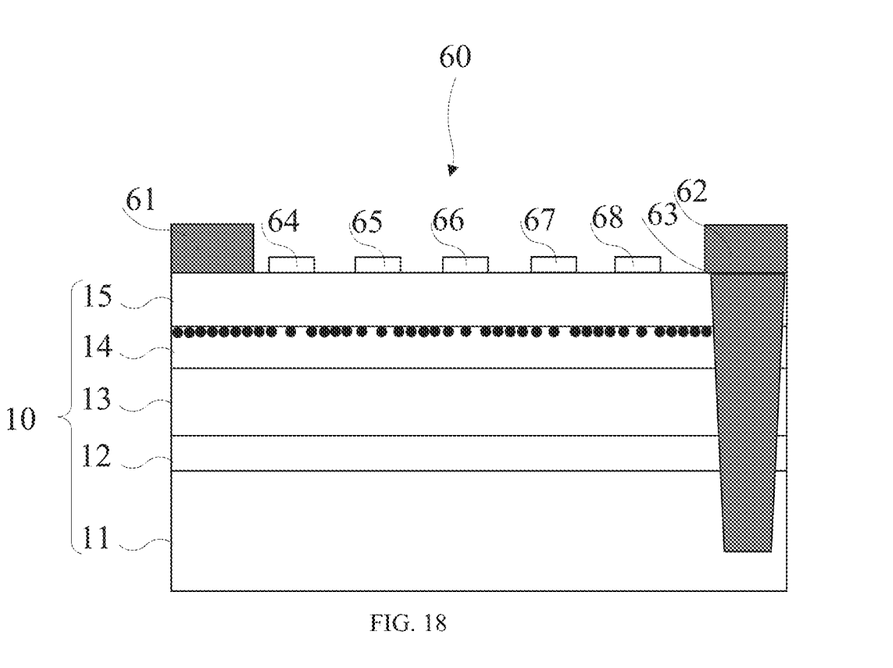
FIG. 18 shows a schematic diagram of a thinned P-GaN type high-resistance two-dimensional electron gas integrated resistor.
Figure 19:
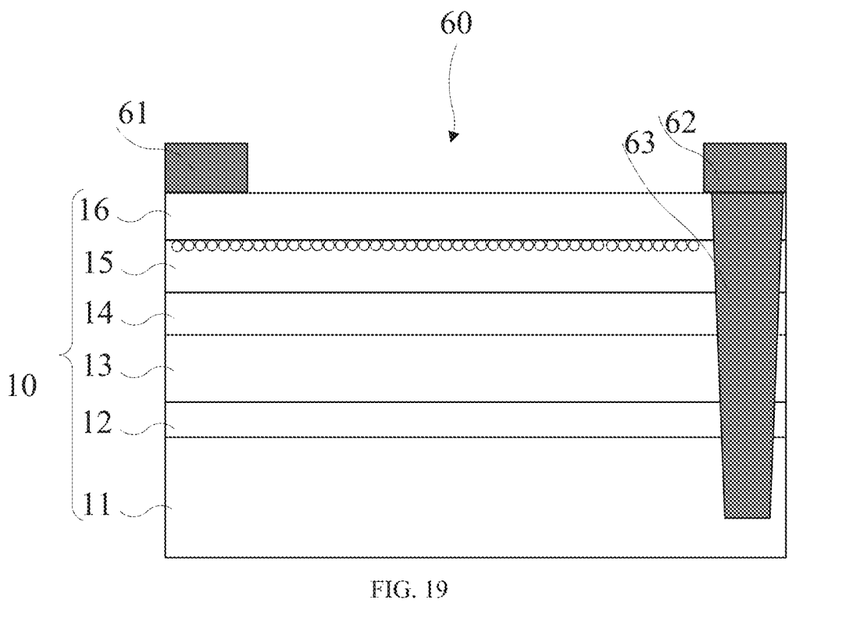
FIG. 19 shows a schematic diagram of a high-resistance two-dimensional hole gas integrated resistor.

In Embodiments 1 and 2, the integrated resistors are in the form of a two-dimensional electron gas resistor shown in FIG. 16, with low resistivity. In this embodiment, FIG. 17 shows a groove-type high-resistance two-dimensional electron gas resistor, in which the barrier layer 15 is etched at intervals to form grooves. FIG. 18 shows a thinned P-GaN type high-resistance two-dimensional electron gas resistor, in which a fourth P-GaN layer 64, a fifth P-GaN layer 65, a sixth P-GaN layer 66, a seventh P-GaN layer 67, and an eighth P-GaN layer 68 are grown at intervals above the barrier layer 15. FIG. 19 shows a high-resistance two-dimensional hole gas resistor, in which a ninth P-GaN layer 16 is grown above the barrier layer 15 and the two-dimensional hole gas formed by the P-GaN layer 16 and the barrier layer 15 forms a resistor. The groove-type high-resistance two-dimensional electron gas resistor and the thinned P-GaN type high-resistance two-dimensional electron gas resistor increase resistivity by reducing the concentration of two-dimensional electron gas. The high-resistance two-dimensional hole gas resistor uses two-dimensional hole gas with a smaller mobility than the two-dimensional electron gas to form an integrated resistor with a larger resistivity.

The invention claimed is:

1. A monolithically integrated GaN-based half-bridge circuit, comprising: a base, the base comprising a conductive substrate, a nucleation layer, a buffer layer, a channel layer and a barrier layer being sequentially provided on the conductive substrate, and an oxide passivation layer being provided on the barrier layer, wherein the base further comprises isolation layers, the isolation layers start from a surface of the barrier layer, pass through the barrier layer and the channel layer before entering the buffer layer, the barrier layer and the channel layer are divided by the isolation layers to form a diode capacitor region, a low-side transistor region, a high-side transistor region, a first resistor region and a second resistor region, a diode and an integrated capacitor are arranged on the diode capacitor region, and a low-side transistor, a high-side transistor, a first integrated resistor and a second integrated resistor are respectively arranged on the low-side transistor region, the high-side transistor region, the first resistor region and the second resistor region;

the diode comprises a source metal connected to an upper surface of the barrier layer in the diode capacitor region, a first P-GaN layer, and a cathode metal that also serves as a plate of the integrated capacitor, wherein a gate metal is provided on the first P-GaN layer, and the source metal is connected to the gate metal and serves as an anode of the diode; a ground metal serving as another plate of the integrated capacitor is provided on a surface of the oxide passivation layer;

the low-side transistor comprises a low-side transistor source metal connected to the upper surface of the barrier layer in the low-side transistor region, a second P-GaN layer, and a low-side transistor drain metal, wherein a low-side transistor gate metal is provided on the second P-GaN layer;

the high-side transistor comprises a high-side transistor source metal connected to the upper surface of the barrier layer in the high-side transistor region and connected to the low-side transistor drain metal and the anode of the diode, a third P-GaN layer, and a high-side transistor drain metal, wherein a high-side transistor gate metal is provided on the third P-GaN layer;

the first integrated resistor and the second integrated resistor are connected in series at a series node that is connected to the conductive substrate, one end of series connection of the first integrated resistor and the second integrated resistor is connected to the high-side transistor drain metal, and the other end of the series connection of the first integrated resistor and the second integrated resistor is connected to the ground metal.

2. The monolithically integrated GaN-based half-bridge circuit according to claim 1, wherein a first substrate through-hole metal is formed in the diode capacitor region, the first substrate through-hole metal is connected to the cathode metal, and the first substrate through-hole metal extends and is connected to the conductive substrate; a second substrate through-hole metal is formed in the first resistor region or the second resistor region, the second substrate through-hole metal is connected to the series node of the first integrated resistor and the second integrated resistor and extends to be connected to the conductive substrate; the first substrate through-hole metal and the diode capacitor region are located on one side of the barrier layer, and the second substrate through-hole metal, the first resistor region and the second resistor region are located on the other side of the barrier layer.

3. The monolithically integrated GaN-based half-bridge circuit according to claim 2, wherein a silicon dielectric layer is provided between the plate and the another plate of the integrated capacitor.

4. The monolithically integrated GaN-based half-bridge circuit according to claim 1, wherein a first substrate through-hole metal is formed in the barrier layer, and the first substrate through-hole metal extends and is connected to the conductive substrate, the first substrate through-hole metal is connected to the cathode metal and the series node of the first integrated resistor and the second integrated resistor respectively, and the anode of the diode is connected to the high-side transistor source metal through an anode metal and is connected to an output terminal Vout; the first substrate through-hole metal, the cathode metal, the anode metal and the output terminal Vout are located in a middle part of the GaN-based half-bridge circuit, the first integrated resistor and the second integrated resistor are respectively located on both sides of the middle part, and the low-side transistor and the high-side transistor are respectively located on both sides of the middle part.

5. The monolithically integrated GaN-based half-bridge circuit according to claim 4, wherein a silicon dielectric layer is provided between the plate and the another plate of the integrated capacitor.

6. The monolithically integrated GaN-based half-bridge circuit according to claim 1, wherein a silicon dielectric layer is provided between the plate and the another plate of the integrated capacitor.

7. A half-bridge circuit, comprising: a low-side transistor and a high-side transistor, a drain of the low-side transistor being connected to a source of the high-side transistor and also connected to an output terminal Vout, and a substrate of the low-side transistor being connected to a substrate of the high-side transistor, wherein a series resistor is connected in parallel to a high-side transistor drain metal and a low-side transistor source metal, and the series resistor is composed of a first integrated resistor and a second integrated resistor connected in series at a series node that is connected to a conductive substrate; an integrated capacitor is connected in parallel to the series node and the low-side transistor source metal; a diode is connected between the output terminal Vout and the series node, and the diode has an anode connected to the output terminal Vout and a cathode connected to the series node.

8. The half-bridge circuit according to claim 7, wherein the low-side transistor and the high-side transistor are GaN HEMT devices.

* * * * *